(12) United States Patent
Lipp (10) Patent No.: US 7,209,938 B2
(45) Date of Patent: Apr. 24, 2007

(54) KALMAN FILTER WITH ADAPTIVE MEASUREMENT VARIANCE ESTIMATOR

(75) Inventor: John I. Lipp, Lewisville, TX (US)

(73) Assignee: Lockheed Martin Corporation, Bethesda, MD (US)

( * ) Notice: Subject to any disclaimer, the term of this patent is extended or adjusted under 35 U.S.C. 154(b) by 797 days.

(21) Appl. No.: 10/023,346

(22) Filed: Dec. 17, 2001

(65) Prior Publication Data

US 2003/0115232 A1    Jun. 19, 2003

(51) Int. Cl.
*G06F 17/10* (2006.01)

(52) U.S. Cl. ..................................... 708/300

(58) Field of Classification Search .............. 708/300, 708/322–323
See application file for complete search history.

(56) References Cited

U.S. PATENT DOCUMENTS

| | | | | |
|---|---|---|---|---|
| 5,640,429 A | * | 6/1997 | Michels et al. | 375/340 |
| 5,867,411 A | * | 2/1999 | Kumar | 708/300 |
| 6,463,411 B1 | * | 10/2002 | Li et al. | 704/226 |
| 6,693,979 B1 | * | 2/2004 | Kumar | 375/326 |
| 2003/0171830 A1 | * | 9/2003 | Thomson et al. | 700/55 |

* cited by examiner

*Primary Examiner*—Tan V. Mai
(74) *Attorney, Agent, or Firm*—Williams, Morgan & Amerson PC (57) ABSTRACT

A Kalman filtering technique employing an adaptive measurement variance estimator is disclosed. The Kalman filtering technique includes a signal filtering mechanism, the signal filtering mechanism futher includes a Kalman filter and a variance estimator. The variance estimation used in the filtering includes estimating the variance of the measured quantity signal and generating the variance estimate signal for use in filtering the input signal and the measured quantity signal, wherein estimating the variance of the measured quantity signal includes determining a smoothed estimate of the measured quantity's variance from the measured quantity signal. The invention also manifests itself as a method for filtering and estimating, a program storage medium encoded with instructions that, when executed by a computer, performs such a method, an electronic computing device programmed to perform such a method, and a transmission medium over which the method is performed.

35 Claims, 7 Drawing Sheets

KALMAN FILTER WITH ADAPTIVE MEASUREMENT VARIANCE ESTIMATOR

This application is related to my commonly assigned, co-pending application Ser. No. 10/022,497, filed on even date herewith, entitled "Multipath Mitigation Filter", now allowed, which is hereby incorporated by reference for all purposes as if expressly set forth verbatim herein.

BACKGROUND OF THE INVENTION

1. Field of the Invention

The present invention pertains to the filtering of sensed signals and, in particular, to a Kalman filter including an adaptive measurement variance estimator.

2. Description of the Related Art

Discrete Kalman filtering is extensively used in modem day digital control and signal processing for a variety of purposes. Among these purposes are to: "smooth" signals, i.e., reduce measurement noise; observe unmeasured states; and/or predict future system states. In a typical discrete Kalman filter, all of the system parameters are specified. These system parameters typically include the:

state transition matrix;

state input gains;

plant uncertainty covariance function matrix; and measurement covariance function matrix.

However, the measurement covariance function matrix is frequently unknown. In these cases, an ad hoc value for the measurement covariance function matrix is used. Although this estimate is better than nothing, it nevertheless impairs the performance of the Kalman filter in its intended function, i e., smoothing, observing, and/or predicting.

For instance, consider a system described mathematically as follows using the notations defined in Table 1 below:

$$x[n]=A[n]x[n-1]+B[n]w[n]+C[n]u[n] \quad (1)$$

$$z[n]=H[n]x[n]+v[n] \quad (2)$$

wherein:

u[n]≡the input to the system;

z[n]≡the measured output of the system; and x[n]≡state of the system.

The quantities w[n] and v[n] are mutually independent, white, noise processes with discrete variance functions Q[n]δ[n] and R[n]δ[n], respectively. In the art, Eq. (1) is known as the "state transition model" and Eq. (2) is the "measurement model." One known filtering technique based on a Kalman filter employs the following set of equations for determining the measurement variance estimate R̂[n] for the nth sample:

$$\hat{x}[n|n-1]=A[n]\hat{x}[n-1]+C[n]u[n] \quad (3)$$

$$P[n|n-1]=A[n]P[n-1]A[n]^T+B[n]Q[n]B[n]^T \quad (4)$$

$$e[n]=z[n]-H[n]\hat{x}[n|n-1] \quad (5)$$

$$\hat{\sigma}_e^2[n]=\hat{\sigma}_e^2[n-1]+H[n]G[n](e^2[n]-\hat{\sigma}_e^2[n-1]) \quad (6)$$

$$\hat{R}[n]=max(0, \hat{\sigma}_e^2[n]-H[n]P[n|n-1]H[n]^T) \quad (7)$$

$$K[n] = \frac{P[n|n-1]H^T}{HP[n|n-1]H^T + \hat{R}[n]} \quad (8)$$

$$\hat{x}[n]=\hat{x}[n|n-1]+K[n](z[n]-H[n]\hat{x}[n|n-1]) \quad (9)$$

$$P[n]=(I-K[n]H[n])P[n|n-1]) \quad (10)$$

Note the calculation of the variance estimation R̂[n]. Note also that these are but mathematical descriptions of sensed signals, e.g., electrical, magnetic, or optical signals representing tangible real world phenomena or characteristics of such phenomena.

This technique can essentially be broken down into three parts. First, the current state is predicted (Eq. (3), Eq. (4)). Next, the variance of the measured quantity is estimated (Eq. (5), Eq. (6), and Eq. (7)). Then, the current state is updated with the measurement (Eq. (8), Eq. (9), Eq. (10)). This known technique's variance estimate R̂[n] is often quite large. Also, it is possible for the measurement variance estimate to be zero, which happens in practice, and causes all manner of problems.

TABLE 1

Definitions of Mathematical Notation

| Symbol | Dimensions | Description |
|---|---|---|
| x[n] | N × 1 | System state vector (scalar in the case N = 1) |
| x̂[n] | N × 1 | Current state vector estimate |
| x̂[n\|n − 1] | N × 1 | Predicted state vector (estimate of state vector from previously estimated state vector) |
| P[n] | N × N | State vector estimate covariance matrix |
| P[n\|n − 1] | N × N | State vector prediction covariance matrix |
| w[n] | L × 1 | System driving noise |
| Q[n] | L × L | System driving noise covariance matrix |
| u[n] | J × 1 | System input vector |
| z[n] | 1 × 1 | System measurement |
| K[n] | N × 1 | Kalman filter gain vector |
| v[n] | 1 × 1 | Measurement noise |
| R[n] | 1 × 1 | Measurement variance |
| R̂[n] | 1 × 1 | Estimated measurement variance |
| A[n] | N × N | State transition matrix |
| B[n] | N × L | System driving noise gain matrix |
| C[n] | N × J | System input gain matrix |
| H[n] | 1 × N | Input state gain vector |
| G[n] | 1 × 1 | Error filter gain |
| δ[n] | 1 × 1 | Discrete kronecker delta function |
| e[n] | 1 × 1 | Prediction error |
| σ̂$_e^2$[n] | 1 × 1 | Prediction Error variance estimate |

The present invention is directed to resolving, or at least reducing, one or all of the problems mentioned above.

SUMMARY OF THE INVENTION

The invention is a Kalman filter with an adaptive measurement variance estimator.

In a first aspect, the invention includes a signal filtering mechanism, comprising a Kalman filter and a variance estimator. The Kalman filter is capable of receiving an input signal, a measured quantity signal, and a variance estimate, and outputting a state estimate signal. The variance estimator is capable of estimating the variance of the measured quantity signal and generating the variance estimate signal for use in filtering the input signal and the measured quantity signal, wherein estimating the variance of the measured quantity signal includes determining a smoothed estimate of the measured quantity's variance from the measured quantity signal.

In a second aspect, the invention includes a method for estimating the current state of a discrete, vector-state, scalar-measurement system. The method begins by estimating the variance of a measured quantity for use in filtering an input quantity and the measured quantity. The estimation includes determining a smoothed estimate of the instantaneous prediction error's variance. The method also filters the input quantity and the measured quantity through a Kalman filter using the estimated variance of the measured quantity signal.

In other manifestations, the invention includes an electronic computing device programmed to perform such a method, a transmission medium over which such a method may be performed, or a program storage medium encoded with instruction that, when executed by a computer, perform a method for estimating the current state of a discrete, vector-state, scalar-measurement system. The method includes, inter alia, determining a smoothed estimate of the instantaneous prediction error's variance.

BRIEF DESCRIPTION OF THE DRAWINGS

The invention may be understood by reference to the following description taken in conjunction with the accompanying drawings, in which like reference numerals identify like elements, and in which.

While the invention is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION OF THE INVENTION

Illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort, even if complex and time-consuming, would be a routine undertaking for those of ordinary skill in the art having the benefit of this disclosure.

Figure 1:
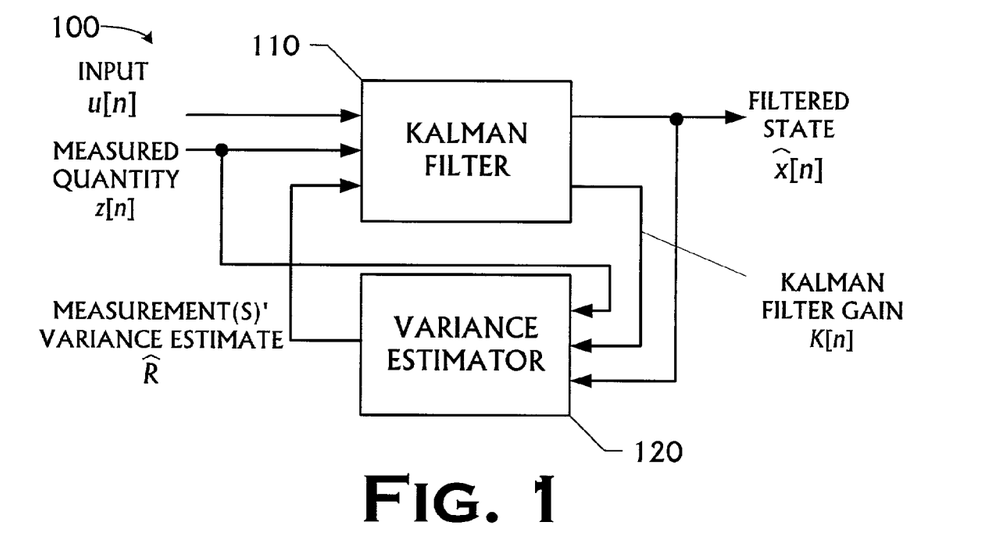
FIG. 1 conceptually depicts a signal filtering mechanism in accordance with the present invention.
Figure 2A:
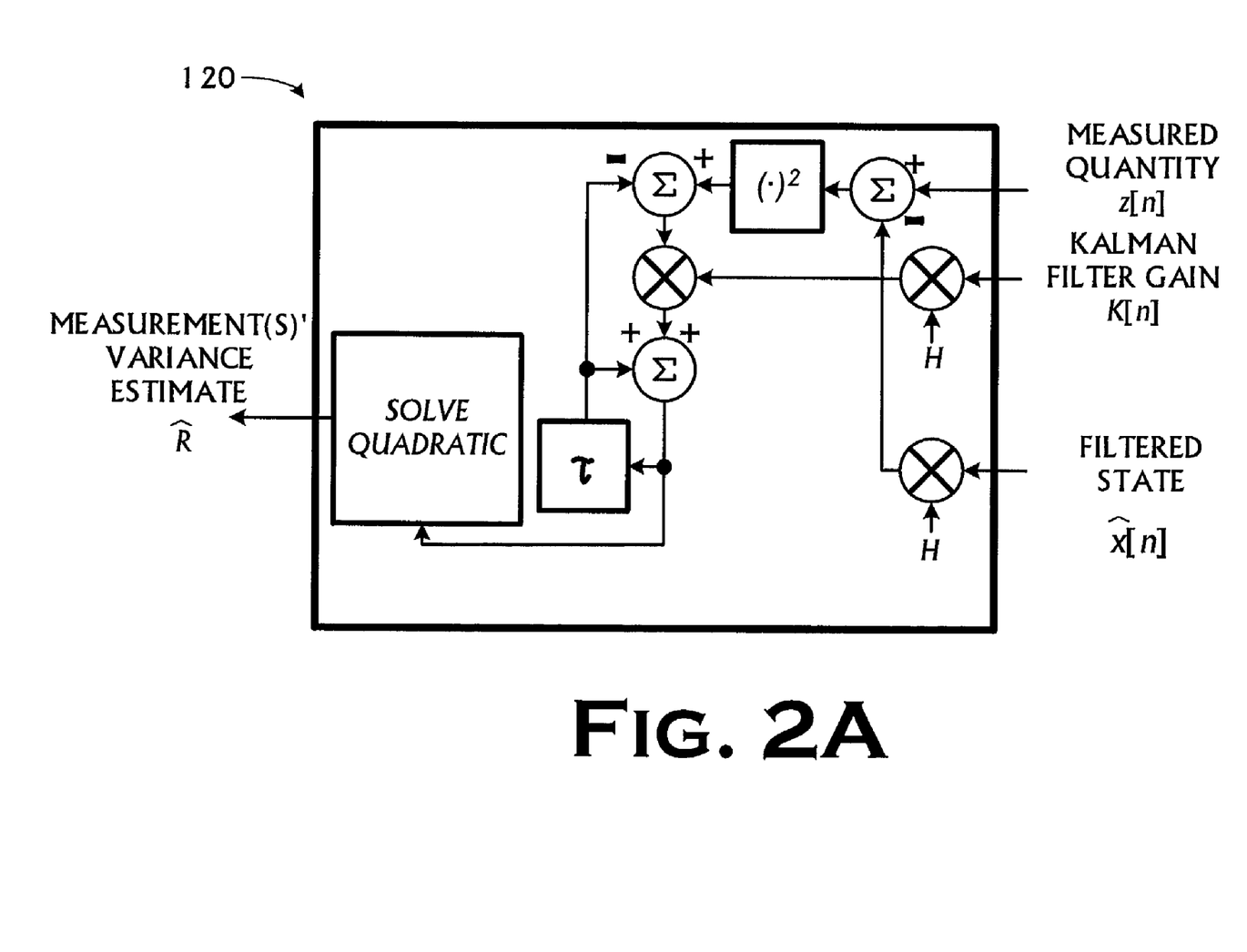
FIG. 2A and FIG. 2B conceptually depict particular embodiments of the variance estimator employed in the signal filtering mechanism of FIG. 1 in alternative embodiments.
Figure 2B:
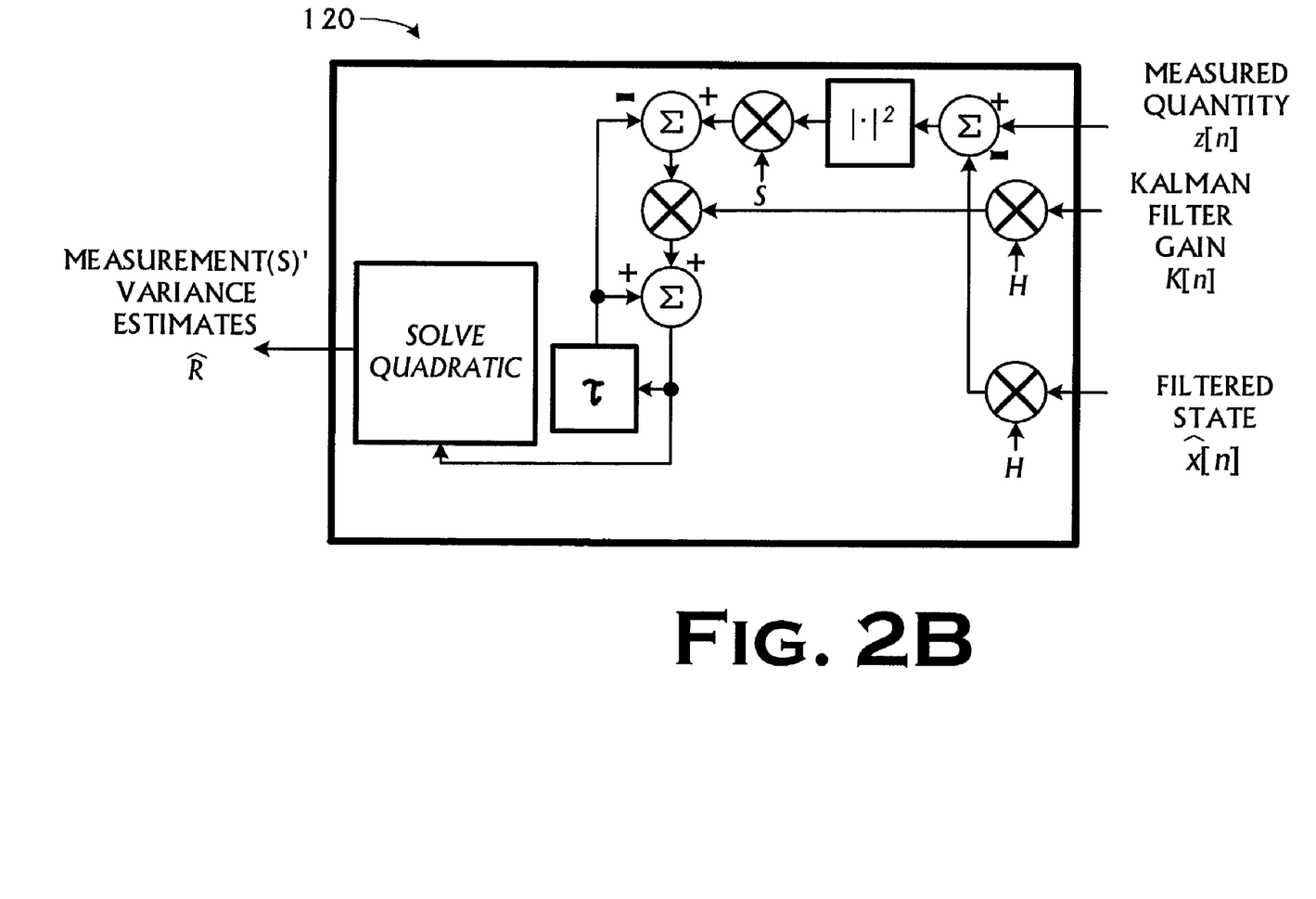

Turning now to the drawings, FIG. 1 conceptually illustrates a filtering mechanism 100 in accordance with the present invention. The filtering mechanism 100 includes a Kalman filter 110 and a variance estimator 120. One particular implementation for the variance estimator 120 is conceptually illustrated in FIG. 2A. A second, alternative particular implementation is shown in FIG. 2B. Note the time delay τ in both FIG. 2A and FIG. 2B. Both these alternative embodiments are discussed further below. In accordance with the notation of Table 1, for the nth sampling of the associated quantities:

u[n]≡the input to the system;
z[n]≡the measured output of the system;
x[n]≡the current state of the system;
K[n]≡the gain of the Kalman filter 110; and
R[n]≡the variance of the input, or the measured output, or both, depending on the embodiment.

The "^" notation indicates an estimate for a given quantity. Thus, $\hat{R}[n]$ and $\hat{x}[n]$ are estimates of the variance of the input R[n] and the state of the system x[n], respectively.

For a continuous-time system the typical notation is x(t). Here, the invention is in reference to a discrete-time system with a (generally) uniform sampling rate Δt, denoted x[n], where n is an integer denoting the samples of x(t). That is, x[n]=x(nΔt) under ideal, uniform sampling. With this notation, a discrete, vector-state, scalar-measurement system model is denoted $$x[n]=A[n]x[n-1]+B[n]w[n]+C[n]u[n] \quad (11)$$

$$z[n]=H[n]x[n]+v[n] \quad (12)$$

where w[n] and v[n] are mutually independent, white, noise processes with discrete-time variance functions Q[n]δ[n] and R[n]δ[n], respectively. Eq. (11) is the state model and Eq. (12) is the measurement model for the system.

Note that the present invention employs the same starting point as does the known filtering technique discussed above. The measurements z[n] and input u[n] are Kalman filtered via the sequence of equations $$\hat{x}[n|n-1]=A[n]\hat{x}[n-1]+C[n]u[n] \quad (13)$$

$$P[n|n-1]=A[n]P[n-1]A[n]^T+B[n]Q[n]B[n]^T \quad (14)$$

$$K[n] = \frac{P[n|n-1]H[n]^T}{H[n]P[n|n-1]H[n]^T + \hat{R}[n-1]} \quad (15)$$

$$\hat{x}[n]=\hat{x}[n|n-1]+K[n](z[n]-H[n]\hat{x}[n|n-1]) \quad (16)$$

$$P[n]=(I-K[n]H[n])P[n|n-1] \quad (17)$$

to arrive at an estimate $\hat{x}[n]$ of the true state $x[n]$. Eq. (13) is the prediction of $x[n]$ and Eq. (14) is the associated covariance matrix $P[n]$ prediction. Eqs. (15)–(17) update the state prediction $\hat{x}[n|n-1]$ and the predicted covariance matrix $P[n|n-1]$ with the measurement $z[n]$.

Figure 3:
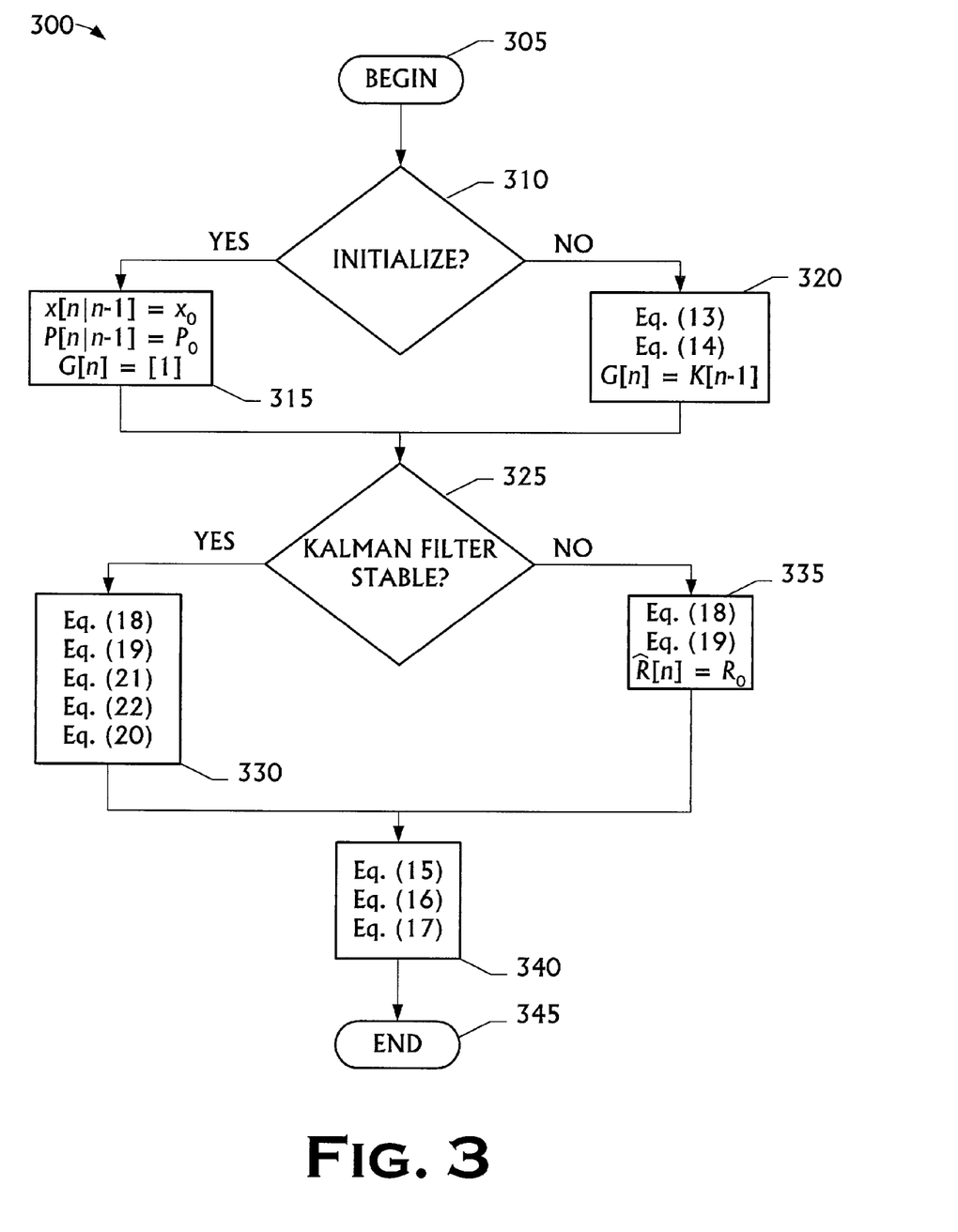
FIG. 3 is a flowchart of one iteration in a first embodiment of the filtering technique implemented by the filtering mechanism of FIG. 1.

However, the variance estimation of the measured quantity signal $z[n]$ is performed differently than in the known technique discussed above. The estimation of $R[n]$ is accomplished by filtering the squared instantaneous prediction error $e^2[n]$ where $$e^2[n]=(z[n]-H[n]\hat{x}[n|n-1])^2 \quad (18)$$

via Eq. (19):

$$\hat{\sigma}_e^2[n]=\hat{\sigma}_e^2[n-1]+H[n]G[n](e^2[n]-\hat{\sigma}_e^2[n-1]) \quad (19)$$

which gives a smoothed estimate of the error variance, $\hat{\sigma}_e^2[n]$. A suitable choice, but not the only choice, for $G[n]$ is $K[n-1]$. This implementation uses a matrix of all ones, written [1], for $G[1]$ since $K[0]$ is undefined. Solve $$\hat{R}[n]^2(2a^2[n]-1)+\hat{R}[n][\hat{\sigma}_e^2[n](1-3a^2[n])-2q[n]]+$$
$$\hat{\sigma}_e^2[n](q[n]+\hat{\sigma}_e^2[n]a^2[n])=0 \quad (20)$$

with the quadratic equation where $$a[n]=\frac{H[n]A[n]H[n]^T}{H[n]H[n]^T} \quad (21)$$

$$q[n]=(H[n]B[n])Q[n](H[n]B[n])^T \quad (22)$$

for the estimate $\hat{R}[n]$ of $R[n]$, which is used in the Kalman filter update cycle. Eqs. (18) thru (22) should be computed between the Kalman filter prediction and update; that is, between Eq. (14) and Eq. (15) as is shown in the flowchart of FIG. 3, discussed below. The value of $q[n]$ in Eq. (20) is but one possible value for $q[n]$. An order of magnitude increase or decrease has been found to be appropriate depending on the implementation. Significant adjustment, i.e., more that a few percent, of $a[n]$ is not recommended.

The derivation of the determination for $\hat{R}[n]$ used above shall now be presented. Without loss of generality, the discrete-time index notation $[n]$ is suppressed except where explicitly required. It is $Hx[n|n-1]$ that is interesting and its variance $HP[n|n-1]H^T$. As a Kalman filter converges, $P[n] \approx P[n-1]$. Letting $n \to \infty$, equality holds, that is, $P[\infty]=P[n]=P[n-1]$. $P[\infty]$ can be found by solving the Ricatti equation. Likewise, as $n \to \infty$, $\sigma_e^2[\infty] \equiv \text{var}(e[\infty])=HP[\infty]H^T+R[\infty]$. Assume that $\hat{R}[\infty]=R[\infty]$, that is, the estimator converges to the true value. From the Ricatti equation, $$\frac{1}{HP[\infty]H^T} = \frac{1}{(HA)P[\infty](HA)^T+(HB)Q(HB)^T} + \frac{1}{R[\infty]} \quad (23)$$

For convenience, make the approximation $$(HA)P[\infty](HA)^T \cong (HAH^{-1})HP[\infty]H^T(HAH^{-1})^T = \quad (24)$$
$$\left(\frac{HAH^T}{HH^T}\right)^2 HP[\infty]H^T$$

where $H^{-1}=(HH^T)^{-1}H^T$ is the Moores-Penrose inverse of $H$. The reason for performing this approximation is so that the substitution $$HP[\infty]H^T=\sigma_e^2[\infty]-R[\infty] \quad (25)$$

can be made to eliminate $P[\infty]$. Combining (21)–(25) and performing some algebra yields $$R^2[\infty](2a[n]^2-1)+R[\infty][\sigma_e^{2[\infty]}(1-3a[n]^2)-2q[n]]+\sigma_e^2 \quad (26)$$
$$[\infty](q[n]+\sigma_e^2[\infty]a[n]^2)=0$$

Typically, a Kalman filter converges, or "stabilizes," after a dozen or so measurements. After this point, it is also expected that the smoothed, squared, instantaneous error $\hat{\sigma}_e^2[n]$ has converged to approximately $\sigma_e^2[\infty]$. This suggests using Eq. (26) at sample time n instead of $\infty$ which leads to the above invention. The approximation in Eq. (24) changes the left term of the right-hand side of Eq. (23). Consequently, adjustment of q, generally upward, may improve performance.

For a more concrete example of this first embodiment, consider a simple two-dimensional state system where $x_1[n]$ is position, $x_2[n]$ is velocity, and $w[n]$ is acceleration. The position state $x[n]$ is measured. The matrices of interest are then $$A[n]=\begin{bmatrix} 1 & \Delta t \\ 0 & 1 \end{bmatrix} \quad (27)$$

$$B[n]Q[n]B[n]^T = \sigma_w^2 \begin{bmatrix} \Delta t^3/3 & \Delta t^2/2 \\ \Delta t^2/2 & \Delta t \end{bmatrix} \quad (28)$$

$$H[n]=[1\ 0] \quad (29)$$

where $\Delta t$ is the time step and $\sigma_w^2$ is the acceleration variance. Consequently, $a[n]=1$ and $q[n]=\sigma_w^2\Delta t^3/3$. Note, however, it has been experimentally found that $q[n]=\sigma_w^2\Delta t$ provides better results. Eq. (20) then becomes $$\hat{R}[n]^2-2\hat{R}[n][\hat{\sigma}_e^2[n]+q[n]]+\hat{\sigma}_e^2[n](q[n]+\hat{\sigma}_e^2[n])=0 \quad (30)$$

which is easily solved with the quadratic equation for the positive root $$\hat{R}[n]=(q[n]+\hat{\sigma}_e^2[n])+\sqrt{q[n](q[n]+\hat{\sigma}_e^2[n])} \quad (31)$$

This value is then used in the estimation, updates, and determinations discussed above.

Initial operation of the Kalman filter should not employ the solution of Eq. (20) until the filter has stabilized, or "converged." Up to that point, a fixed, reasonable, a priori estimate of the input measurement variance $R[n]$ should be used in place of $\hat{R}[n]$. The Kalman filter should otherwise be initialized with standard methods such as a priori estimates $x_0$ and $P_0$ for initializing $x[n]$ and $P[n]$, respectively. The conditions defining "convergence" or "stabilization" are well known to those skilled in the art. In one particular embodiment, the initialization period is chosen to be a number of iterations (e.g., 10–20) experimentally determined as a point after which the Kalman filter has converged. This initialization takes approximately 10 seconds in this particular embodiment. However, the initialization period and its determination will be implementation specific.

FIG. 3 is a flowchart of one iteration 300 of the first embodiment of the filtering technique discussed above. One such iteration 300 is performed for each measurement sample. The iteration 300 begins at the terminator 305 and determines in the decision block 310 whether the Kalman filter needs to be initialized. If so, then the iteration 300 sets the value of x[n|n−1] to $x_0$, the value of P[n|n−1] to $P_0$, and the value of G[n] to [1] in the block 315. If not, then the embodiment applies Eq. (13) and Eq. (14) and sets the value of G[n] to K[n−1] in the block 320. The iteration 300 then determines whether the Kalman filter has stabilized in the block 325. If so, then the iteration 300 applies Eq. (18), Eq. (19), Eq. (21), Eq. (22), and Eq. (20) in the block 330 to estimate the variance $\hat{R}$[n] of the measured quantity z[n]. If not, then the iteration 300 applies Eq. (18) and Eq. (19) and sets the value of $\hat{R}$[n] to $R_0$ in the block 335. The iteration 300 then performs the updates by applying the Kalman filter in Eq. (15), Eq. (16), and Eq. (17) in the block 340. The iteration 300 ends at the terminator 345. Subsequent iterations are performed until all the measurement samples n of interest have been filtered.

Figure 4:
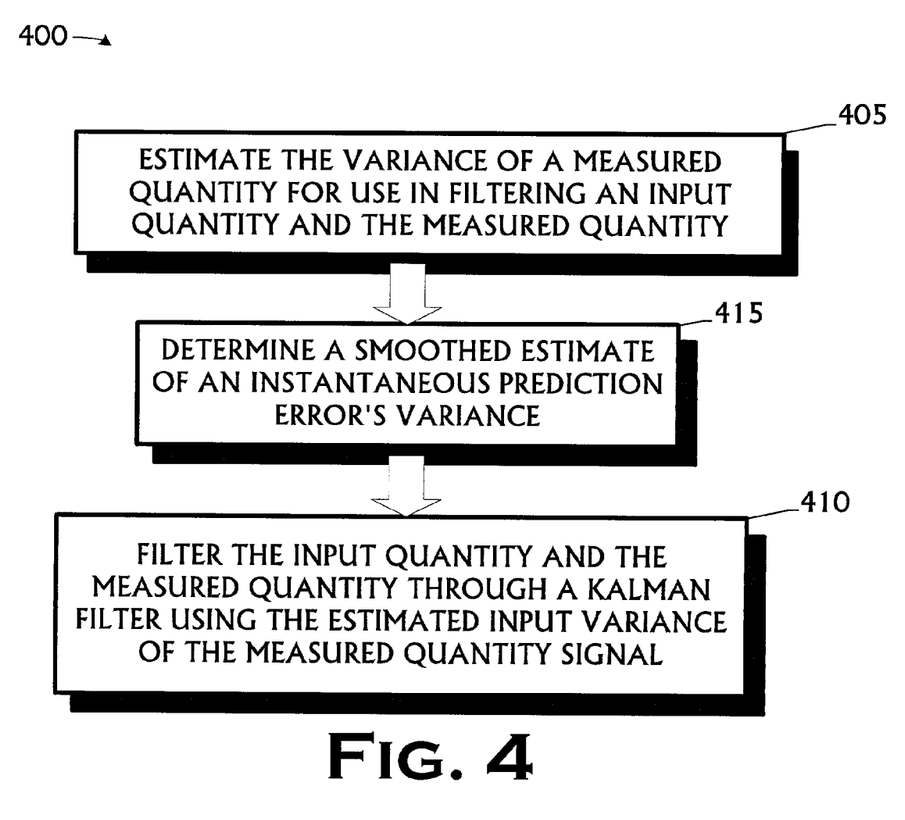
FIG. 4 illustrates a method for filtering a signal to estimate the variance of a measured quantity signal in accordance with the present invention.

Thus, one difference between the known technique discussed above and the present invention lies in the estimation $\hat{R}$[n] of the variance of the measured quantity. FIG. 4 illustrates one particular method 400 for estimating the variance of a measured quantity used to predict the current state of a discrete, vector-state, scalar-measurement system. The iteration 300 illustrated in FIG. 3 is but one particular embodiment of the method 400 in FIG. 4. The method 400 generally comprises estimating (finding $\hat{R}$[n]) the variance R[n] of the measured quantity z[n] for use in filtering an input quantity u[n] and the measured quantity z[n], as set forth in the box 405. Then, a smoothed estimate of an instantaneous prediction error's variance $\hat{\sigma}_e^2$[n] is determined, as set forth in the box 410. Next, the input quantity u[n] and the measured quantity z[n] are filtered through a Kalman filter using the estimated input variance of the measured quantity signal, as set forth in the box 415.

However, in the filtering technique discussed above relative to FIG. 1, FIG. 2, and FIG. 3, the estimate of the input variance $\hat{R}$[n] is calculated very differently than in the known technique as was previously mentioned. This is apparent from comparing Eq. (10) with Eqs. (18)–(20). Thus, more particularly, the variance estimate $\hat{R}$[n] in the present invention is arrived at by determining a smoothed estimate of the instantaneous error in the measured quantity z[n], as set forth in the box 415 of FIG. 4. In the embodiment illustrated in FIG. 1, FIG. 2, and FIG. 3, determining the smoothed estimate includes first determining the squared instantaneous prediction error $e^2$[n] and smoothing it to yield the smoothed, squared instantaneous prediction error $\hat{\sigma}_e^2$[n]. The variance estimate $\hat{R}$[n] is then estimated from the smoothed squared instantaneous prediction error $\hat{\sigma}_e^2$[n].

Figure 5:
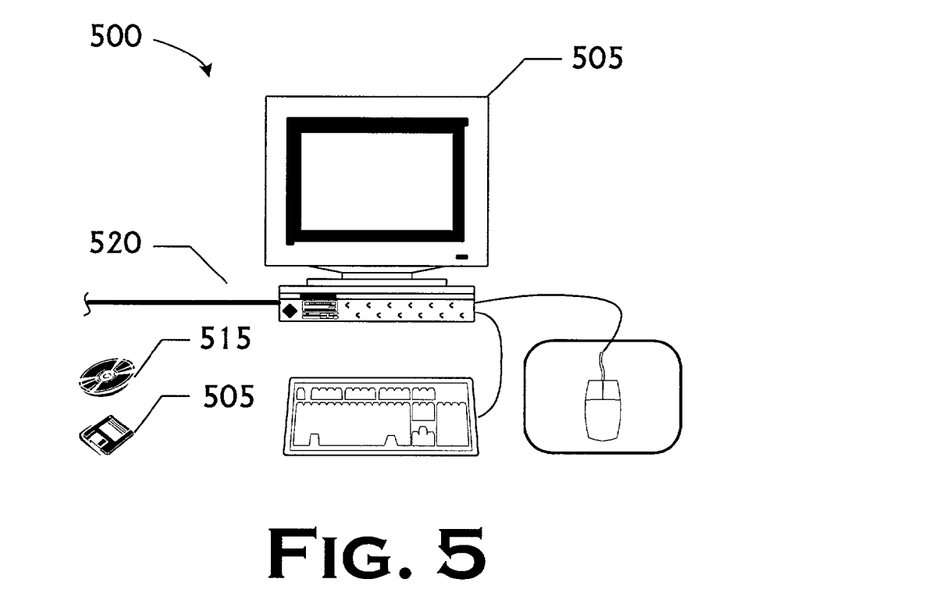
FIG. 5 depicts one particular electronic computing device with which the signal filtering mechanism of FIG. 1 and FIG. 4 may be implemented.

FIG. 5 illustrates one particular embodiment of a computing system 500 with which the invention may be implemented in one particular aspect of the invention. The present invention is typically implemented in software. A measured signal z[n] is converted to a digital representation, and then filtered by processing the digital representation using software implementing the method described in relation to FIG. 4, or one of the variations thereon previously discussed, in the filtering mechanism 100 of FIG. 1. In various manifestations, the invention may also be:

- an electronic computing device (e.g., the computer 505) programmed to perform the method 400 of FIG. 4;
- a program storage medium (e.g., the floppy disk 510 or the optical disk 515) encoded with instructions that, when executed by a computer (e.g., the computer 505), perform the method 400 of FIG. 4; or
- a transmission medium (e.g., the cable 520) over which the method 400 of FIG. 4 may be performed on data stored on a remote computer (e.g. the computer 505).

The invention admits wide variation in this aspect. For instance:

- the illustrated computer 505 is a workstation, but may be a desktop, laptop, mini-, a mainframe computer, or a processor (e.g., a digital signal processor, or "DSP", or a microprocessor) embedded in a piece of equipment (e.g., a receiver) in various implementations;
- the computing system 500 might comprise many computing devices such as the computer 505, configured in a local area network ("LAN"), a wide area network ("WAN"), a system area network ("SAN"), an "intranet," or even a portion of the Internet;
- the program storage medium may be magnetic (e.g., the floppy disk 510) or optical (e.g., the optical disk 515);
- the program storage medium may be random access (e.g., the floppy disk 510) or read only (e.g., the optical disk 515); and
- the illustrated transmission medium 520 is a coaxial cable, but may also be a twisted wire pair or an optical fiber.

The invention is not limited to implementation specific details such as these.

Figure 6:
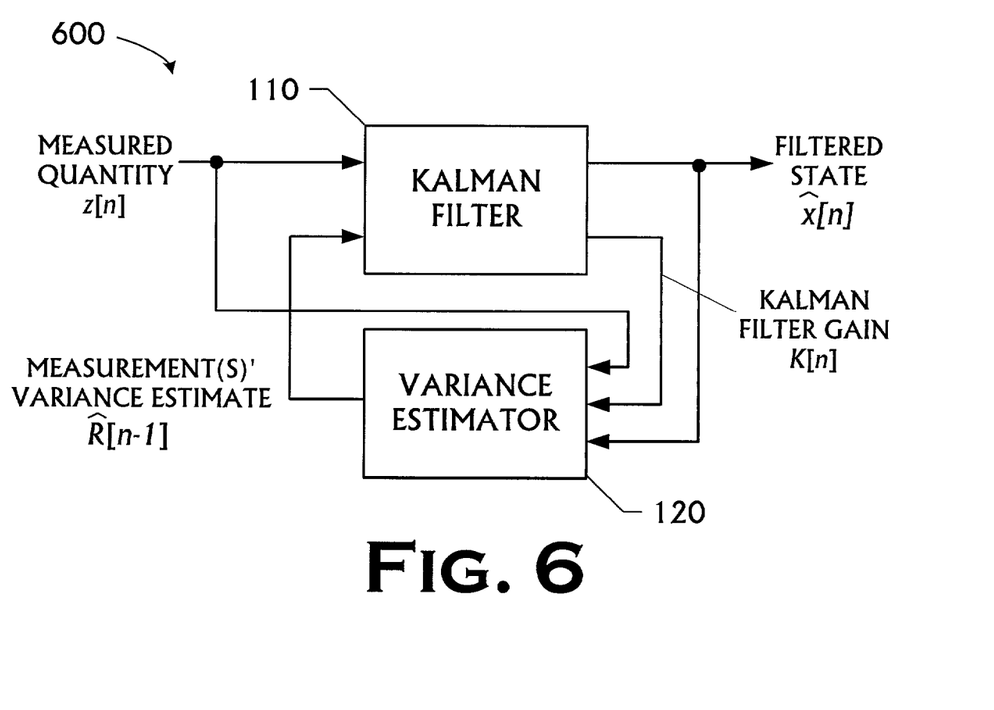
FIG. 6 conceptually illustrates one particular implementation of the filtering mechanism wherein the filtering mechanism is employed in an "observer" configuration.

FIG. 6 conceptually illustrates one particular implementation 600 of the filtering mechanism 100 in FIG. 1 wherein the filtering mechanism is employed in an "observer" configuration using the filtering technique of the iteration 300 in FIG. 3. Since this implementation is an observer configuration, there is no input u[n], i.e., u[n]=0 and the Kalman filter 110 receives only the measured quantity z[n]. Note that this does not affect the particular embodiment of the variance estimator 120 shown in FIG. 2, which does not receive the input u[n]. Thus, consider a discrete, vector-state, scalar-measurement system model defined as:

$$x[n]=Ax[n-1]+Bw[n] \quad (32)$$

$$z[n]=Hx[n]+v[n] \quad (33)$$

wherein w[n] and v[n] are independent white Gaussian noises with covariance function matrices Qδ[n] and Rδ[n], respectively. The measurements z[n] can be Kalman filtered via the sequence of equations similar to those set forth above. However, a prediction $\hat{x}$[n|n−1] for the current state x[n] is determined using only the previous state vector value $\hat{x}$[n−1] (i.e., the state at the time of the previous sampling):

$$\hat{x}[n|n-1]=A\hat{x}[n-1] \quad (34)$$

Eq. (14)–Eq. (22) can then be applied in the manner discussed above for the general case. Again, in determining $\hat{R}$[n] for the next Kalman filter cycle in the implementation of FIG. 6, it is Hx[n] that is interesting and its variance HP[n]$H^T$, and its derivation is similar to that in the general case, as well. Note that this particular embodiment uses the variance estimator of FIG. 2A.

Figure 7:
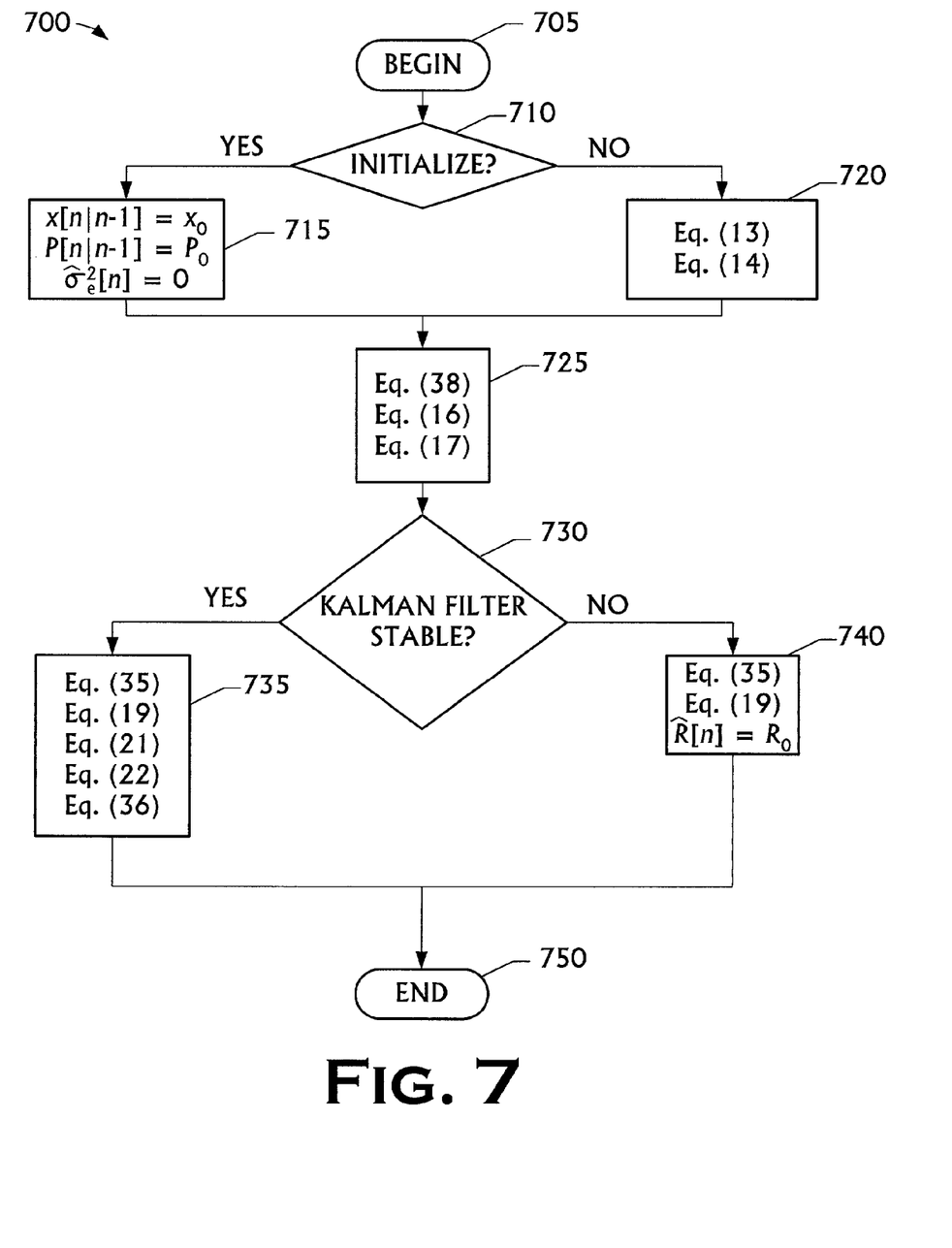
FIG. 7 is a flowchart of one iteration in a second embodiment of the filtering technique implemented by the filtering mechanism of FIG. 1.

In a second embodiment alternative to that discussed relative to FIG. 3, the estimated input variance is determined slightly differently. FIG. 7 is a flowchart illustrating one iteration of this second embodiment. The second embodiment replaces Eq. (18) with $$e^2[n] = (z[n] - H[n]\hat{x}[n])^2 \quad (35)$$

The advantage is the error variance is lower after the filtering update. This changes the equation for $\hat{R}[n]$ to $$\hat{R}[n]^4 \frac{a^2[n]}{(\hat{\sigma}_e^2[n])^2} + \hat{R}[n]^3 \frac{1-3a^2[n]}{\hat{\sigma}_e^2[n]} + \hat{R}[n]^2(2a^2[n]-1)\left(1 - \frac{q[n]}{\hat{\sigma}_e^2[n]}\right) + (\hat{R}[n]3q[n] + q^2[n])(a^2[n]-1) = 0 \quad (36)$$

which can be solved using the quartic or other polynomial root solving procedure. A special case of interest is when $a=1$. This reduces the quartic to a quadratic that is more easily solved yielding $$\hat{R}[n] = \hat{\sigma}_e^2[n] + \sqrt{q[n]\hat{\sigma}_e^2[n]} \quad (37)$$

The disadvantage of this scheme is that the estimate $\hat{R}[n]$ of $R[n]$ to the Kalman filter equations is delayed one iteration. Thus, Eq. (15) is replaced with $$K[n] = \frac{P[n \mid n-1]H[n]^T}{H[n]P[n \mid n-1]H[n]^T + \hat{R}[n-1]} \quad (38)$$

and the variance estimation and Kalman filter "update" steps are temporally swapped.

For one implementation of this second embodiment, consider the special case of $a=1$. The required square root is typically an expensive operation. The square root can be eliminated by filtering the absolute error $$|e[n]| = |z[n] - H[n]\hat{x}[n]| \quad (39)$$

via $$\hat{\sigma}_e[n] = \hat{\sigma}_e[n-1] + H[n]G[n](S[n]|e[n]| - \hat{\sigma}_e[n-1]) \quad (40)$$

instead of the squared error. The constant $S[n]$ is a scale factor that accounts for the difference between using the absolute versus the squared error. For Gaussian noise, a typical model, $S[n] = \sqrt{\pi/2} \approx 1.25$. Then Eq. (37) becomes $$\hat{R}[n] = (\hat{\sigma}_e[n])^2 + \hat{\sigma}_e[n]\sqrt{q[n]} \quad (41)$$

Typically, the square root of $q[n]$ is a constant independent of $n$ and only need be computed once, or is otherwise inexpensive to compute. This one implementation of the second embodiment follows the FIG. 7, wherein $\hat{\sigma}_e^2[n]=0$ is changed to $|\hat{\sigma}_e[n]|=0$, Eq. (35) is replaced by Eq. (39), Eq. (19) is replaced by Eq. (40), and Eq. (36) is replaced by Eq. (41), respectively. Note that this particular embodiment uses the variance estimator of FIG. 2B.

The derivation of the determination for $\hat{R}$ used in this second embodiment shall now be presented. In this variation of the second embodiment, the alternate scheme the squared error is $e^2[n] = (z[n] - H[n]\hat{x}[n])^2$. The procedure is modified by eliminating $P[\infty]$ with the appropriate substitution found from the expected value of $e^2[n]$, $$HP[\infty]H^T = \frac{R^2[\infty]}{\hat{\sigma}_e^2[\infty]} - q - R[\infty] \quad (42)$$

yielding $$R^4[\infty]\frac{a^2}{(\hat{\sigma}_e^2[\infty])^2} + R^3[\infty]\frac{1-3a^2}{\hat{\sigma}_e^2[\infty]} + R^2[\infty](2a^2 - 1)\left(1 - \frac{q}{\hat{\sigma}_e^2[\infty]}\right) + (R[\infty]3q + q^2)(a^2 - 1) = 0 \quad (43)$$

yielding which can be solved using a quartic or other root solving procedure. In the modified implementation of this embodiment, the constant $S[n]$ in the modified alternate scheme is found via $$S[n] = \frac{\sqrt{E\{e^2[n]\}}}{E\{|e[n]|\}} \quad (44)$$

where $E\{\ \}$ is the expectation operator.

Returning to FIG. 7, the iteration 700 begins at the terminator 705 and first determines whether the Kalman filter 110 is initialized in the decision box 710. If so, then the iteration 700 sets $\hat{x}[n|n-1]=x_0$, $P[n|n-1]=P_0$, and $\hat{\sigma}_e^2[n]=0$, as set forth in the box 715. If not, then the iteration 700 applies Eq. (13) and Eq. (14) in box 720 to predict the state estimate $\hat{x}[n|n-1]$. The iteration 700 then applies Eq. (38), Eq. (16), and Eq. (17), as set forth in the box 725. The iteration 700 then determines whether the Kalman filter 110 is stable in the decision box 730. If so, the iteration 700 applies Eq. (35), Eq. (19), Eq. (21), Eq. (22), and Eq. (36), as set forth in the box 735 to estimate the variance of the measured quantity $z[n]$. If not, the iteration 700 applies Eq. (35) and Eq. (19) and sets $\hat{R}[n]=R_0$, as set forth in the box 740. The iteration 700 then ends at the terminator 750. Subsequent iterations are performed until all the samples $n$ of interest have been filtered.

Figure 8:
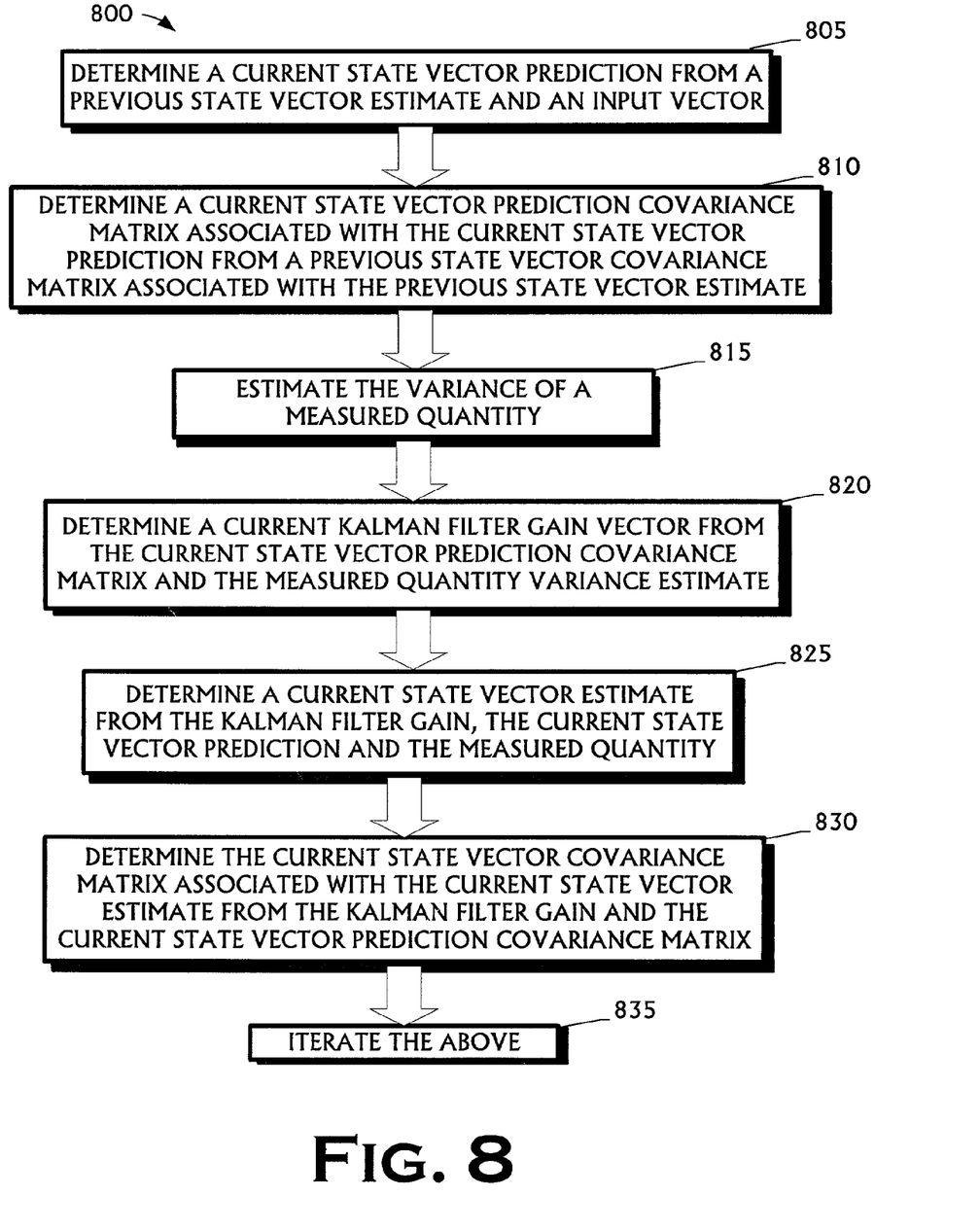
FIG. 8 illustrates a method for estimating the current state of a discrete, vector-state, scalar-measurement system in accordance with the present invention.

Now, extrapolating from the first and second embodiments illustrated in FIG. 3 and in FIG. 7, FIG. 8 illustrates a method 800 for estimating the current state of a discrete, vector-state, scalar-measurement system in accordance with the present invention. Assuming the system is initialized and that the Kalman filter has stabilized, the method 800 begins by first determining a current state vector prediction $\hat{x}[n|n-1]$ from a previous state vector estimate $\hat{x}[n-1]$ and an input vector $u[n]$, as set forth in the box 805. Next, the method 800 determines a current state vector prediction covariance matrix $P[n|n-1]$ associated with the current state vector prediction $\hat{x}[n|n-1]$ from a previous state vector covariance matrix $P[n-1]$ associated with the previous state vector estimate $\hat{x}[n-1]$, as set forth in the box 810.

The variance estimate $\hat{R}[n]$ for the measured quantity $z[n]$ is then determined, as set forth in the box 815. This estimation is performed using the method 400 in FIG. 4, e.g., as in one of the first and second embodiments illustrated in FIG. 3 and in FIG. 7. The current Kalman filter gain vector $K[n]$ is then determined from the current state vector prediction covariance matrix $P[n|n-1]$ and the measured quantity variance estimate, as set forth in the box 820. Next, the current state vector estimate is determined from the Kalman filter gain $K[n]$, the current state vector prediction, and the measured quantity, as set forth in the box 825. The current state vector covariance matrix associated with the current state vector estimate is then determined from the Kalman filter gain and the current state vector prediction covariance matrix, as set forth in the box 830. Finally, the method 800 iterates the above, as set forth in the box 835, until all samples of the system have been filtered.

This concludes the detailed description. Note that some portions of the detailed descriptions herein are presented in terms of a software implemented process involving symbolic representations of operations on data bits within a memory in a computing system or a computing device. These descriptions and representations are the means used by those in the art to most effectively convey the substance of their work to others skilled in the art. The process and operation require physical manipulations of physical quantities. Usually, though not necessarily, these quantities take the form of electrical, magnetic, or optical signals capable of being stored, transferred, combined, compared, and otherwise manipulated. It has proven convenient at times, principally for reasons of common usage, to refer to these signals as bits, values, elements, symbols, characters, terms, numbers, or the like.

It should be borne in mind, however, that all of these and similar terms are to be associated with the appropriate physical quantities and are merely convenient labels applied to these quantifies. Unless specifically stated or otherwise as may be apparent, throughout the present disclosure, these descriptions refer to the action and processes of an electronic device, that manipulates and transforms data represented as physical (electronic, magnetic, or optical) quantities within some electronic device's storage into other data similarly represented as physical quantities within the storage, or in transmission or display devices. Exemplary of the terms denoting such a description are, without limitation, the terms "processing," "computing," "calculating," "determining," "displaying," and the like.

Furthermore, the invention has numerous applications in a wide variety of fields. One such application is disclosed in my commonly assigned, co-pending application Ser. No. 10/022,497, filed on even date herewith, entitled "Multipath Mitigation Filter", now allowed, incorporated by reference above. Multipath is a condition wherein received electromagnetic radiation may have propagated over multiple paths, which introduces error or uncertainty in measurements derived from those signals. For instance, a radar signal received after being echoed from an object may have traveled directly and/or indirectly from the object to the receiver. The present invention can be used to mitigate uncertainty or error arising from this phenomenon. Still other applications may become apparent to those skilled in the art having the benefit of this disclosure. For example, the invention may also be used in an image processing application. In this case, x- and y- coordinates are used instead of time and spatial invariance is used instead of time-invariance.

Finally, the particular embodiments disclosed above are illustrative only, as the invention may be modified and practiced in different but equivalent manners apparent to those skilled in the art having the benefit of the teachings herein. Furthermore, no limitations are intended to the details of construction or design herein shown, other than as described in the claims below. It is therefore evident that the particular embodiments disclosed above may be altered or modified and all such variations are considered within the scope and spirit of the invention. Accordingly, the protection sought herein is as set forth in the claims below.

What is claimed:

1. A signal filtering mechanism, comprising:
   a Kalman filter capable of receiving an input signal, a measured quantity signal, and a variance estimate signal for the measured quantity signal, and outputting a state estimate signal; and
   a variance estimator capable of estimating the variance of the measured quantity signal and generating the variance estimate signal for use in filtering the input signal and the measured quantity signal, wherein estimating the variance of the measured quantity signal includes determining a smoothed estimate of the measured quantity's final variance from the measured quantity signal.

2. The signal filtering mechanism of claim 1, wherein determining the smoothed estimate comprises:
   determining the squared instantaneous prediction error of the measured quantity signal;
   smoothing the determined, squared instantaneous prediction error; and
   estimating the measured quantity's variance from the smoothed squared instantaneous prediction error.

3. The signal filtering mechanism of claim 1, wherein determining the smoothed estimate comprises:
   determining the absolute instantaneous prediction error in the measured quantity signal;
   smoothing the determined, absolute instantaneous prediction error; and
   estimating the measured quantity's variance from the smoothed absolute instantaneous prediction error.

4. A method for estimating the variance of a measured quantity used to predict the current state of a discrete, vector-state, scalar-measurement system, the method comprising:
   estimating the variance of a measured quantity for use in filtering an input quantity and the measured quantity;
   determining a smoothed estimate of an instantaneous prediction error's final variance; and
   filtering the input quantity and the measured quantity through a Kalman filter using the estimated input variance of the measured quantity signal.

5. The method of claim 4, wherein determining the smoothed estimate of the variance of the instantaneous prediction error of the measured quantity signal comprises:
   determining the squared instantaneous prediction error in the measured quantity signal;
   smoothing the determined, squared instantaneous prediction error; and
   estimating the variance from the smoothed squared instantaneous prediction error.

6. The method of claim 5, further comprising initializing a plurality of quantities used in estimating the current state of the discrete, vector-state, scalar-measurement system.

7. The method of claim 6, wherein initializing the plurality of quantities includes:
   setting the prediction of the initial state of the system to a first predetermined value; and
   setting the initial prediction covariance matrix associated with the predicted initial state of the system to a second predetermined value; and
   one of:
      setting the error filter gain to a third predetermined value; or
      setting the smoothed squared instantaneous prediction error to 0.

8. The method of claim 7, wherein the third predetermined value is a vector of ones.

9. The method of claim 7, wherein the error filter gain is set to a third predetermined value and filtering the input quantity and the measured quantity includes determining a Kalman filter gain vector, a current state vector estimate, and a state vector estimate covariance matrix after estimating the variance of the measured quantity.

10. The method of claim 7, wherein the smoothed squared instantaneous prediction error is set to 0 and filtering the input quantity and the measured quantity includes determining a Kalman filter gain vector, a current state vector estimate, and a state vector estimate covariance matrix before estimating the variance.

11. The method of claim 4, wherein determining the smoothed estimate of the variance of the instantaneous prediction error of the measured quantity signal comprises:
   determining the absolute instantaneous prediction error in the measured quantity signal;
   smoothing the determined, absolute instantaneous prediction error; and
   estimating the variance from the smoothed absolute instantaneous prediction error.

12. The method of claim 11, further comprising initializing a plurality of quantities used in estimating the current state of the discrete, vector-state, scalar-measurement system.

13. The method of claim 12, wherein initializing the plurality of quantities includes:
   setting the prediction of the initial state of the system to a first predetermined value; and
   setting the initial prediction covariance matrix associated with the predicted initial state of the system to a second predetermined value; and
   one of:
      setting the error filter gain to a third predetermined value; or
      setting the smoothed absolute instantaneous prediction error to 0.

14. The method of claim 13, wherein the third predetermined value is a vector of ones.

15. The method of claim 13, wherein the error filter gain is set to a third predetermined value and filtering the input quantity and the measured quantity includes determining a Kalman filter gain vector, a current state vector estimate, and a state vector estimate covariance matrix after estimating the variance of the measured quantity.

16. The method of claim 13, wherein the smoothed absolute instantaneous prediction error is set to 0 and filtering the input quantity and the measured quantity includes determining a Kalman filter gain vector, a current state vector estimate, and a state vector estimate covariance matrix before estimating the variance.

17. A method for estimating the current state of a discrete, vector-state, scalar-measurement system, the method comprising:
   determining a current state vector prediction from a previous state vector estimate and an input vector;
   determining a current state vector prediction covariance matrix associated with the current state vector prediction from a previous state vector covariance matrix associated with the previous state vector estimate;
   estimating the variance of a measured quantity, wherein estimating the variance includes:
      determining a squared instantaneous prediction error of the measured quantity from the measured quantity and one of the current state vector estimate and the previous state vector estimate;
      smoothing the squared instantaneous prediction error; and
      estimating the final variance of the measured quantity from the smoothed squared instantaneous prediction error;
   determining a current Kalman filter gain vector from the current state vector prediction covariance matrix and the measured quantity variance estimate;
   determining a current state vector estimate from the Kalman filter gain, the current state vector prediction, and the measured quantity;
   determining the current state vector covariance matrix associated with the current state vector estimate from the Kalman filter gain and the current state vector prediction covariance matrix; and
   iterating the above.

18. The method of claim 17, further comprising initializing a plurality of quantities used in estimating the current state of the discrete, vector-state, scalar-measurement system.

19. The method of claim 18, wherein initializing the plurality of quantities includes:
   setting the value of the current state vector prediction to a first predetermined value;
   setting the current state vector prediction covariance matrix to a second predetermined value; and
   performing one of:
      setting an error filter gain to a third predetermined value; or
      setting the squared instantaneous prediction error to 0.

20. The method of claim 17, wherein the current state vector estimate, the current state vector prediction covariance matrix, and the current Kalman filter gain are updated after the variance of the measured quantity is estimated.

21. The method of claim 20, wherein, in estimating the variance of the measured quantity includes:
   determining the squared instantaneous prediction error in the measured quantity includes applying the following analysis:

$$e^2[n] = (z[n] - H[n]\hat{x}[n|n-1])^2;$$

smoothing the determined, squared instantaneous prediction error includes applying the following analysis:

$$\hat{\sigma}_e^2[n] = \hat{\sigma}_e^2[n-1] + H[n]G[n](e^2[n] - \hat{\sigma}_e^2[n-1]);$$ and estimating the variance of the measured quantity from the smoothed squared instantaneous prediction error comprises:
      setting the estimated variance to a fourth predetermined value if the Kalman filter is not stable; or
      applying the following analysis if the Kalman filter is stable:
         determining the value of a[n] from:

$$a[n] = \frac{H[n]A[n]H[n]^T}{H[n]H[n]^T};$$

determining the value of q[n] from:

$$q[n] = (H[n]B[n])Q[n](H[n]B[n])^T;$$ and solving for $\hat{R}[n]$ from $$\hat{R}[n]^2(2a^2[n]-1) + \hat{R}[n][\hat{\sigma}_e^2[n](1-3a^2[n]) - 2q[n]] + \hat{\sigma}_e^{2[n]}(q[n] + \hat{\sigma}_e^2[n]a^2[n]) = 0.$$

22. The method of claim 17, wherein the current state vector estimate, the current state vector prediction covariance matrix, and the current Kalman filter gain are updated before the variance of the measured quantity is estimated.

23. The method of claim 22, wherein, in estimating the variance of the measured quantity includes:
determining the squared instantaneous prediction error of the measured quantity includes applying the following analysis:

$$e^2[n]=(z[n]-H[n]\hat{x}[n])^2;$$

smoothing the determined, squared instantaneous prediction error includes applying the following analysis:

$$\hat{\sigma}_e^2[n]=\hat{\sigma}_e^2[n-1]+H[n]G[n](e^2[n]-\hat{\sigma}_e^2[n-1]); \text{ and}$$

estimating the variance from the smoothed squared instantaneous prediction error comprises:
setting the estimated variance to a fourth predetermined value if the Kalman filter is not stable; or
applying the following analysis if the Kalman filter is stable:
determining the value of a[n] from:

$$a[n] = \frac{H[n]A[n]H[n]^T}{H[n]H[n]^T};$$

determining the value of a[n] from:

$$q[n]=(H[n]B[n])Q[n](H[n]B[n])^T; \text{ and}$$

solving for $\hat{R}[n]$ from $$\hat{R}[n]^4 \frac{a^2[n]}{(\hat{\sigma}_e^2[n])^2} + \hat{R}[n]^3 \frac{1-3a^2[n]}{\hat{\sigma}_e^2[n]} +$$

$$\hat{R}[n]^2(2a^2[n]-1)\left(1-\frac{q[n]}{\hat{\sigma}_e^2[n]}\right) + (\hat{R}[n]3q[n]+q^2[n])(a^2[n]-1) = 0$$

24. A signal filtering mechanism, comprising:
means for receiving an input signal, a measured quantity signal, and a variance estimate signal for the measured quantity signal, and outputting a state estimate signal; and
means for estimating the variance of the measured quantity signal and generating the variance estimate signal for use in filtering the input signal and the measured quantity signal, wherein estimating the variance of the measured quantity signal includes determining a smoothed estimate of the measured quantity's final variance from the measured quantity signal.

25. The signal filtering mechanism of claim 24, wherein determining the smoothed estimate comprises:
determining the squared instantaneous prediction error of the measured quantity signal;
smoothing the determined, squared instantaneous prediction error; and
estimating the measured quantity's variance from the smoothed squared instantaneous prediction error.

26. The signal filtering mechanism of claim 24, wherein determining the smoothed estimate comprises:
determining the absolute instantaneous prediction error in the measured quantity signal;
smoothing the determined, absolute instantaneous prediction error; and
estimating the measured quantity's variance from the smoothed absolute instantaneous prediction error.

27. A apparatus for estimating the variance of a measured quantity used to predict the current state of a discrete, vector-state, scalar-measurement system, the method comprising:
means for estimating the variance of a measured quantity for use in filtering an input quantity and the measured quantity;
means for determining a smoothed estimate of an instantaneous prediction error's final variance; and
means for filtering the input quantity and the measured quantity through a Kalman filter using the estimated input variance of the measured quantity signal.

28. The apparatus of claim 27, wherein the means for determining the smoothed estimate of the variance of the instantaneous prediction error of the measured quantity signal comprises:
means for determining the squared instantaneous prediction error in the measured quantity signal;
means for smoothing the determined, squared instantaneous prediction error; and
means for estimating the variance from the smoothed squared instantaneous prediction error.

29. The apparatus of claim 27, wherein the means for determining the smoothed estimate of the variance of the instantaneous prediction error of the measured quantity signal comprises:
means for determining the absolute instantaneous prediction error in the measured quantity signal;
means for smoothing the determined, absolute instantaneous prediction error; and
means for estimating the variance from the smoothed absolute instantaneous prediction error.

30. A program storage medium encoded with instructions that, when executed by a computing apparatus, perform a method for estimating the variance of a measured quantity used to predict the current state of a discrete, vector-state, scalar-measurement system, the method comprising:
estimating the variance of a measured quantity for use in filtering an input quantity and the measured quantity;
determining a smoothed estimate of an instantaneous prediction error's final variance; and
filtering the input quantity and the measured quantity through a Kalman filter using the estimated input variance of the measured quantity signal.

31. The program storage medium of claim 30, wherein determining the smoothed estimate of the variance of the instantaneous prediction error of the measured quantity signal in the encoded method comprises:
determining the squared instantaneous prediction error in the measured quantity signal;
smoothing the determined, squared instantaneous prediction error; and
estimating the final variance from the smoothed squared instantaneous prediction error.

32. The program storage medium of claim 30, wherein determining the smoothed estimate of the variance of the instantaneous prediction error of the measured quantity signal in the encoded method comprises:
determining the absolute instantaneous prediction error in the measured quantity signal;
smoothing the determined, absolute instantaneous prediction error; and
estimating the final variance from the smoothed absolute instantaneous prediction error.

33. A computing apparatus programmed to perform a method for estimating the variance of a measured quantity used to predict the current state of a discrete, vector-state, scalar-measurement system, the method comprising:

estimating the variance of a measured quantity for use in filtering an input quantity and the measured quantity;

determining a smoothed estimate of an instantaneous prediction error's final variance; and filtering the input quantity and the measured quantity through a Kalman filter using the estimated input variance of the measured quantity signal.

34. The computing apparatus of claim 33, wherein determining the smoothed estimate of the variance of the instantaneous prediction error of the measured quantity signal in the programmed method comprises:

determining the squared instantaneous prediction error in the measured quantity signal;

smoothing the determined, squared instantaneous prediction error; and estimating the variance from the smoothed squared instantaneous prediction error.

35. The computing apparatus of claim 33, wherein determining the smoothed estimate of the variance of the instantaneous prediction error of the measured quantity signal in the programmed method comprises:

determining the absolute instantaneous prediction error in the measured quantity signal;

smoothing the determined, absolute instantaneous prediction error; and estimating the variance from the smoothed absolute instantaneous prediction error.

* * * * *

UNITED STATES PATENT AND TRADEMARK OFFICE
CERTIFICATE OF CORRECTION

| | | |
|---|---|---|
| PATENT NO. | : 7,209,938 B2 | Page 1 of 1 |
| APPLICATION NO. | : 10/023346 | |
| DATED | : April 24, 2007 | |
| INVENTOR(S) | : John I. Lipp | |

It is certified that error appears in the above-identified patent and that said Letters Patent is hereby corrected as shown below:

Title page, item (73); In the Assignee: replace "Lockheed Martin" with

-- Lockheed Martin Corporation--.

Signed and Sealed this

Fifteenth Day of May, 2007

JON W. DUDAS
*Director of the United States Patent and Trademark Office*